United States Patent [19]

Piotrowski

[11] 4,299,024

[45] Nov. 10, 1981

[54] FABRICATION OF COMPLEMENTARY BIPOLAR TRANSISTORS AND CMOS DEVICES WITH POLY GATES

[75] Inventor: Leo R. Piotrowski, Indian Harbour, Fla.

[73] Assignee: Harris Corporation, Melbourne, Fla.

[21] Appl. No.: 124,201

[22] Filed: Feb. 25, 1980

[51] Int. Cl.³ .................... H01L 21/76; H01L 21/441
[52] U.S. Cl. .................................. 29/577 C; 29/571; 29/578; 29/591; 148/174; 148/187; 148/189; 357/43; 357/44; 357/48; 357/71
[58] Field of Search .................... 29/571, 577 C, 578, 29/580, 591; 148/174, 187, 189; 357/43, 44, 48, 49, 71, 90

[56] References Cited

U.S. PATENT DOCUMENTS

| | | | |
|---|---|---|---|
| 3,576,475 | 4/1971 | Kronlage | 357/43 X |
| 3,609,479 | 9/1971 | Lin et al. | 357/43 |
| 3,818,583 | 6/1974 | Polata | 29/578 |
| 3,865,649 | 2/1975 | Beasom | 148/187 |
| 3,892,606 | 7/1975 | Chappelow et al. | 29/571 X |
| 3,899,373 | 8/1975 | Antipov | 29/571 X |
| 4,075,754 | 2/1978 | Cook | 29/578 X |
| 4,120,707 | 10/1978 | Beasom | 357/43 X |
| 4,191,603 | 3/1980 | Garbarino et al. | 148/187 X |

Primary Examiner—R. Dean
Assistant Examiner—W. G. Saba
Attorney, Agent, or Firm—Leitner, Palan, Martin & Bernstein

[57] ABSTRACT

Specific impurity concentration regions are used for the simultaneous formation of CMOS devices and complementary bipolar transistors to produce high voltage, high performance bipolar transistors. The last diffusion step for shallow P+ and N+ emitter regions and contact regions is performed without a separate diffusion cycle. The formation of the gate oxide at a relatively low temperature is followed immediately by the formation of an undoped polysilicon gate layer. The polysilicon gate layer is doped to a reasonable resistance and also forms a first level interconnect. Phosphorous doped CVD silicon oxide is formed thereover and the top surface is treated with additional phosphorous to produce tapered contact apertures therethrough when etched. A layer of metal is applied and delineated to form contacts to the substrate regions and to form the second level of interconnects.

16 Claims, 8 Drawing Figures

FABRICATION OF COMPLEMENTARY BIPOLAR TRANSISTORS AND CMOS DEVICES WITH POLY GATES

BACKGROUND OF THE INVENTION

The present invention relates generally to the fabrication of insulated gate field effect transistors and bipolar transistors and more specifically to an improved fabrication process to produce high voltage, high performance bipolar transistors and CMOS devices with doped polysilicon gates.

The simultaneous fabrication of the CMOS devices and complementary bipolar transistors are well known as exemplified by U.S. Pat. No. 3,865,649 to Beasom. The processing steps produce a PNP bipolar transistor having a collector to base breakdown voltage of 33 volts. Similarly the $BV_{CEO}$ is less than 20 volts. For certain high voltage, high performance applications, the process described in the Beasom patent is not sufficient. Similarly, Beasom suggests and describes the use of aluminum as the gate of the CMOS structures. This unduly increases the surface area required for the formation of the device and the circuit can have unacceptable levels of stray capacitance between the aluminum and the substrate. Since the aluminum for the gate is also used for the first level interconnects, contact apertures have to be formed subsequent to the formation of the gate oxide and prior to the formation of the aluminum. This can increase the contamination of the gate insulator which undesirably affects the MOS characteristics.

The use of doped polycrystalline silicon gates covered by chemical vapor deposited (CVD) silicon oxide for CMOS devices is well known and is described in U.S. Pat. No. 4,075,754 to Cook, Jr. Although showing the process for the formation of a polysilicon gate for an MOS structure, these processing steps use an impurity concentration and temperature levels not compatible with the simultaneous formation of high voltage, high performance bipolar transistors. Thus, there exists a need for a method of fabricating high voltage, high efficiency bipolar transistors and CMOS devices with polysilicon gates.

SUMMARY OF THE INVENTION

An object of the invention is to provide a process of fabricating high voltage, high performance bipolar transistors with CMOS devices.

Another object of the present invention is to provide a process for fabricating CMOS devices having doped polycrystalline silicon gates and high voltage, high performance bipolar transistors.

An even further object of the present invention is to provide a process of fabricating bipolar transistors having collector-to-base breakdown voltages of greater than 40 volts, $BV_{CEO}$ of greater than 30 volts and peak $f_T$ of greater than 200 megahertz simultaneous with the formation of complementary MOS devices having doped polycrystalline silicon gates and breakdown voltages of greater than 40 volts.

These and other objects of the invention are attained by selecting the impurity concentration, temperatures and cycle times to produce specific impurity concentration regions and specific junction depths with compensation for subsequent formation of gate oxide, gate structure and second level contacts and interconnects. The first impurity introduction is a P conductivity type implant and diffusion to produce the collector of the PNP transistor and the body of the N channel MOS device resulting in a surface impurity concentration of approximately $1.3 \times 10^{16}$ carriers per cubic centimeter. This is followed by an N deposition and diffusion to form the base of the PNP transistor and the source and drain of the N channel MOS device having a surface impurity concentration of $3 \times 10^{18}$ atoms per cubic centimeter. This is followed by a P deposition and diffusion to form the base of the NPN transistor and the source and drain of the P channel MOS device having a surface impurity concentration of $5 \times 10^{18}$ carriers per cubic centimeter. Next, P+ and N+ emitter and contact regions are formed by the introduction of P and N impurities by deposition without separate and distinct diffusion. The diffusion of these P+ and N+ regions will take place during the subsequent processing.

A gate oxide layer is grown of approximately 1,500 angstroms at a moderate temperature of 950° C. This is immediately followed by the deposition of approximately a 6,000 angstroms undoped polysilicon layer. The polysilicon layer is subsequently doped to reduce its resistance and is delineated to form gate structures and first level interconnects. A phosphorous doped silicon dioxide is formed by chemical vapor deposition. This is followed by a reflow of the CVD silicon dioxide and a short phosphorous deposition of impurities. Tapered contact apertures are then formed through the CVD silicon dioxide and the thermally grown oxide to form contacts to the first level interconnects, the gates and the substrate regions. A layer of metal is applied and delineated to form contacts and second level interconnects. This process results in high voltage, high performance bipolar transistors in combination with CMOS devices having polycrystalline gates and CVD silicon oxide insulation.

DESCRIPTION OF THE PREFERRED EMBODIMENTS

Figure 1:
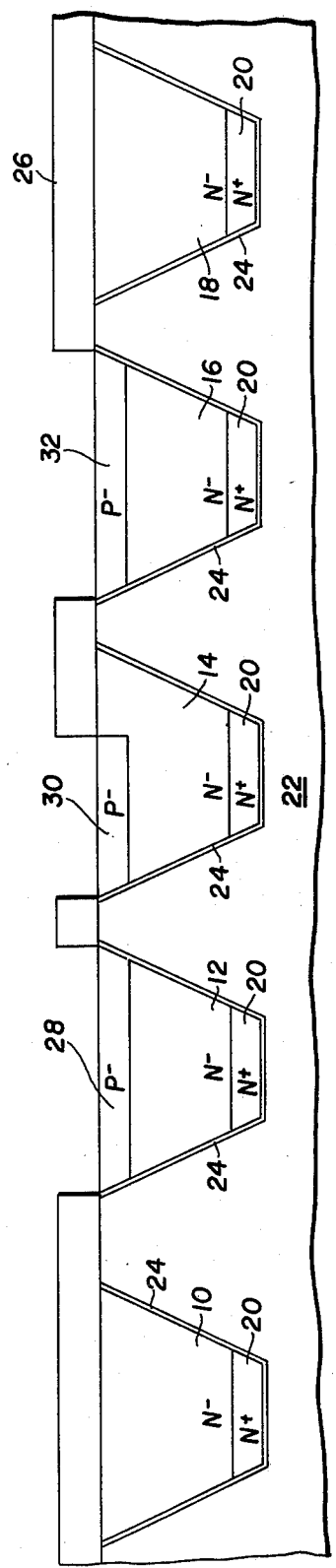
FIGS. 1 through 8 are cross-sectional views of an integrated circuit at successives stages and development in the fabrication of CMOS transistors and complementary bipolar transistors according to the principles of the present invention.

High voltage, high performance complementary bipolar transistors are usually formed in dielectrically isolated regions. As illustrated in FIG. 1, a base or support 22, for example polycrystalline material, has a plurality of N− islands or regions 10, 12, 14, 16 and 18 formed therein and dielectrically isolated from the polycrystalline support 22 and from each other by an insulative layer 24 which may be, for example, an oxide. Buried in each starting N− region is a high impurity N+ buried layer 20. The five islands 10, 12, 14, 16 and 18 are but an example of the plurality of islands which may be formed in the polycrystalline support 22. For example, other N− islands may be formed without a buried N+ region. Similarly, P-type islands may be formed with P+ buried regions.

One example of the method of forming the dielectrically isolated islands is described in U.S. Pat. No. 3,865,649 to J. D. Beasom. The islands 10, 12, 14, 16 and 18 are formed from a starting material which may be an N-type single crystal silicon doped with, for example, antimony, having a resistance in the range of three to twenty ohm-centimeters and preferably three to six ohm-centimeters. This is equivalent to an impurity concentration of $1.6 \times 10^{15}$ carriers per cubic centimeter for 3 ohm-centimeters and $2.4 \times 10^{14}$ carriers per cubic centimeter for 20 ohm-centimeters. The N+ buried regions 20 are formed by diffusing N-type impurities into the N− substrate and have a resistance of generally 100 ohms per square and an impurity concentration in the range of $1 \times 10^{19}$ carriers per cubic centimeter. The starting material is etched, covered with the oxide layer 24 and filled with the polycrystalline support 22. After a grinding operation, the structure of FIG. 1 results. This is but an example of one method of forming the structure of FIG. 1 and does not constitute part of the present invention other than to set the design criteria to which the present invention applies.

The process of the present invention begins by forming a masking layer 26 on the top surface. This masking layer may be an oxide formed by subjecting the wafer to an oxidizing atmosphere at for example 1,100° centigrade to form an oxide layer having a thickness of approximately 5,500 angstroms. A photoresist sequence or process is performed to define the collector region for the PNP bipolar transistor, the base region for an NPN substrate bipolar transistor and the body portion of an N channel MOS field effect transistor. The photoresist sequence includes forming a layer of photosensitive material on the oxide layer 26, exposing the photosensitive material to form the desired aperture pattern and subjecting the exposed photoresist material to a hydrofloric etchant solution which will remove all the oxide from those areas of the wafer not covered by the photoresist.

P-type impurities, for example boron, are then introduced by ion implantation. A typical boron implant would be at an energy of 100,000 volts and a dose of $2.1 \times 10^{13}$ ions per centimeter square. The photoresist layer is then stripped, resulting in the structure of FIG. 1 having ion implanted P− region 28 in island 12, P− region 30 in island 14, and P− region 32 in island 16. The wafer is then subjected to a diffusion cycle in an oxidizing atmosphere to produce P− collector region 28, P− base region 30 and P− body region 32. Preferred diffusion-oxidation cycle at 1200° centigrade in an initial O₂ then N₂ drive-in environment results in a final P− regions 28, 30, and 32 having a surface resistance of 2,500 ohms per square, a junction depth of approximately 8.8 microns and a surface concentration of approximately $1.3 \times 10^{16}$ carriers per cubic centimeter.

These P− regions will produce a PNP transistor having a collector base breakdown of approximately 50 volts, a non-counter doped N channel MOS device having a threshold voltage of +0.8 volts and a breakdown voltage $BV_{DSS}$ of 44 volts with a snapback voltage of about 28 volts. The high PNP collector to base breakdown voltage is required so that the P+ emitter to be formed will result in a breakdown voltage $BV_{CEO}$ of greater than 33 volts for a reasonable $H_{Fe}$ (approximately 150).

Figure 2:
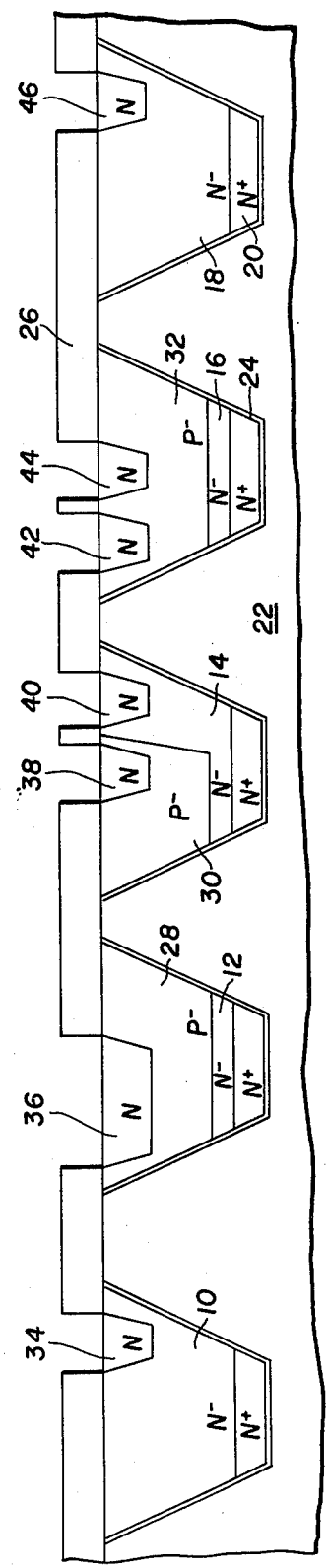

The wafer is then sequenced through another photoresist process to define openings in oxide mask layer 26 for collector contact regions to the NPN collector, base region for the PNP, emitter and contact regions for the substrate NPN, source and drains for the N channel MOS, and body contact for the P channel MOS device. N-type impurities, for example phosphorous, are then deposited to form collector contact region 34 in collector region 10, base region 36 in collector region 28, emitter region 38 in base region 30, collector contact region 40 in collector portion 14, source and drains 42 and 44 in body region 32 and body contact 46 in body region 18 as illustrated in FIG. 2. N-type impurities are then diffused in an oxidizing atmosphere at approximately 1,150° centigrade to fill the apertures in the mask layer 26. The resulting regions 34, 36, 38, 40, 42, 44 and 46 will have a sheet resistance of 140 ohms per square, a junction depth of 2 microns and a surface impurity concentration of approximately $3 \times 10^{18}$ carriers per cubic centimeter. This step is important for N channel MOS channel length control, PNP $f_T$, and substrate NPN $H_{FE}$.

Figure 3:
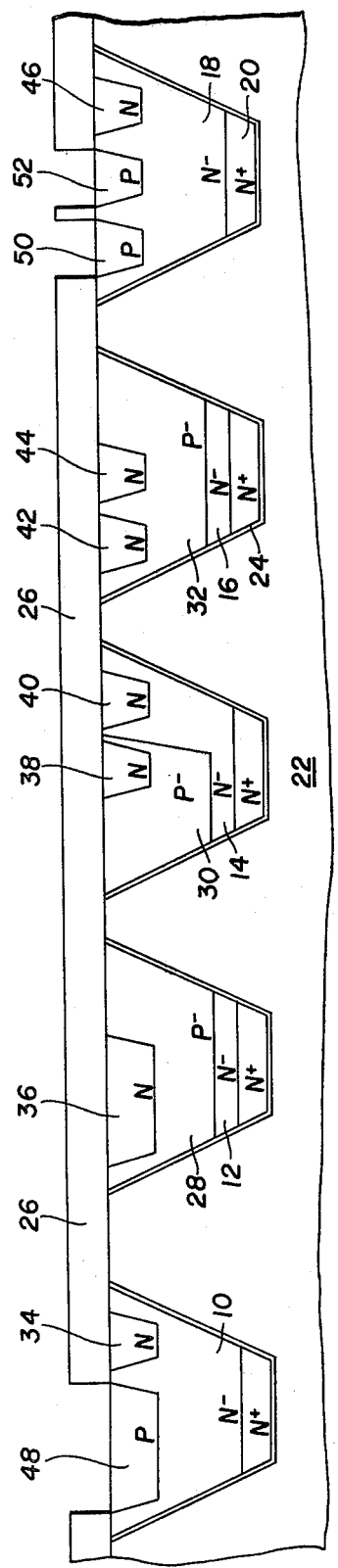

The wafer is then processed through another photoresist sequence to provide openings in the oxide mask layer 26 for the NPN base region and the source and drain for the P channel MOS device. P-type impurities are then deposited through the openings in the oxide mask 26 to form base region 48 in collector 10, and source and drain regions 50 and 52 in body region 18 as illustrated in FIG. 3. The P-type impurities are diffused in an oxidizing atmosphere at 1,150° centigrade to fill the apertures in the oxide layer 26. The resulting P-type regions 48, 50 and 52 will have, for example, a sheet resistance of 280 ohms per square, a junction depth of approximatels 1.8 microns and a surface concentration of approximately $5 \times 10^{18}$ carriers per cubic centimeter. Control of the sheet resistance of these P regions is very critical since a sheet resistance of greater than 300 ohms per square will not provide sufficient control of the to-be-formed N+ emitter cycle due to the effects of boron segregation in subsequent operations. Also a sheet resistance much less than approximately 240 ohms per square can result in a breakdown voltage problem and insufficient final device $H_{FE}$. The junction depth $X_J$ is important for P channel MOS channel length control NPN $f_T$. Thus the sheet resistance should be in a range of 250 to 290 ohms per square.

The wafer is then processed through another photoresist sequence to provide openings in oxide mask layer 26 for P+ base contact of the NPN transistor, P+ emitter and collector contact for the PNP transistor, P+ contact for the base of the substrate NPN transistor, P+ body contact for the N channel MOS device and P+ source and drain contacts for the P channel MOS device. Impurities, for example boron, are deposed at for example 1,100° centigrade without substantial or separate diffusion. This results in base contacts 54 in base region 48, emitter 56 in base 36, collector contact 58 in collector region 28, base contact 60 in base region 30, body contact 62 in body region 32 and source and drain contacts 64 and 66 in source and drain regions 50 and 52, respectively. These regions have a junction depth of approximately 1 micron and a surface concentration of approximately $2 \times 10^{20}$ carriers per cubic centimeter.

Since the source and drain regions are formed prior to the formation of the gate oxide and gate structure, the P+ regions are formed without substantial or separate diffusion. During the temperature processing to follow, the P+ regions 54, 56, 58, 60, 62, 64 and 66 will diffuse an additional 2,000 to 3,000 angstroms. The design of the present step as well as subsequent processing steps are controlled to produce a PNP bipolar transistor having a final $H_{FE}$ in the range of 100 to 180 and a breakdown voltage $BV_{CEO}$ of greater than 33 volts. A protective layer of, for example, silicon dioxide is grown at a low temperature of approximately 900° differential etching rates of the phosphorous to produce tapered contact apertures. The tapered contact apertures produce excellent step coverage for the second interconnect which also forms the contacts from the top plane of CVD silicon dioxide layer 102 to the surface of the substrate. Because of the thickness of the combined thermal oxide layer 26 and the CVD oxide 102, in the range of 1.3 to 1.6 microns, the tapered contact apertures are needed.

Figure 8:
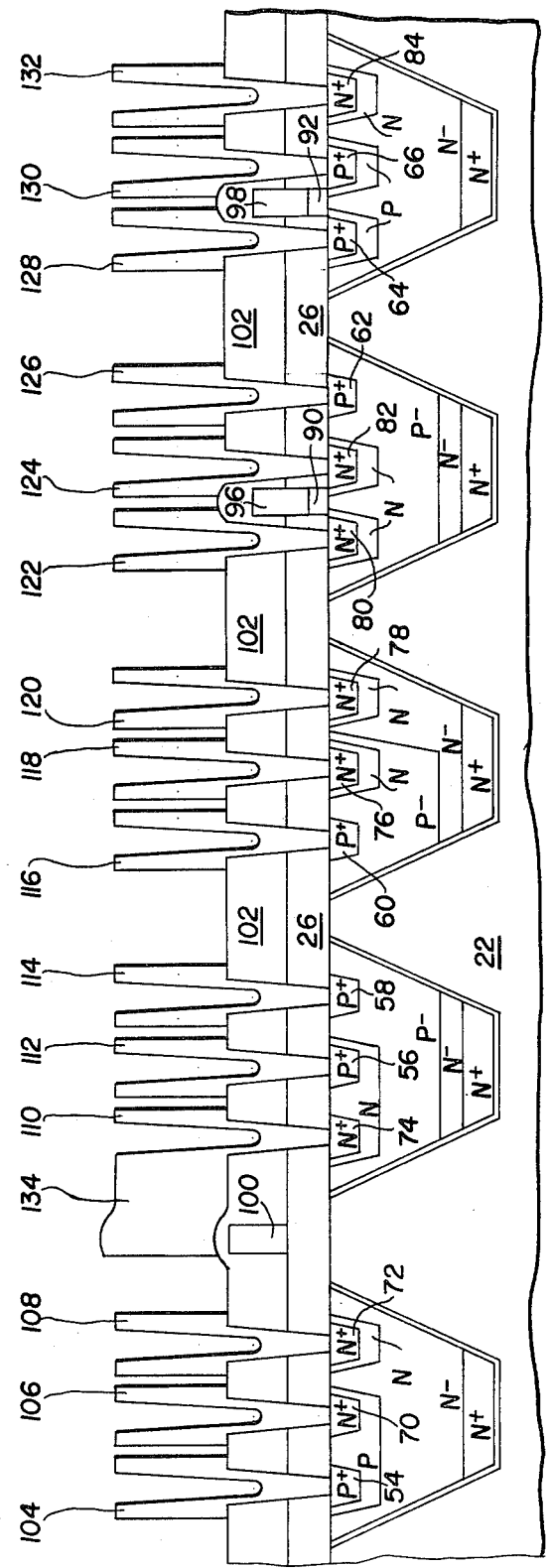

A photoresist sequence is then performed to define the contact aperture to the first level interconnect of doped polycrystalline silicon and to the silicon substrate. A metallic layer, for example aluminum, is applied to the wafer and delineated to form the contact and second level interconnects. The resulting structure is illustrated in FIG. 8. Contacts 104, 106 and 108 are formed to the base, emitter and collector regions 54, 70 and 72, respectively of the NPN bipolar transistor. Contacts 110, 112, and 114 are formed to the base, emitter and collector regions 74, 56, and 58, respectively of the PNP bipolar transistor. Contacts 116, 118 and 120 are formed to the base, emitter and collector regions 60, 76 and 78, respectively of the substrate NPN transistor. Contacts 122, 124, and 126 are formed to the source, drain and body regions 80, 82 and 62, respectively of the N channel device.

Contacts 128, 130, and 132 are formed to the source, drain and body regions 64, 66 and 84, respectively of the P channel MOS device.

For purposes of illustration, contact 110 to the base of the PNP transistor includes an interconnect portion 134. Not illustrated is the remainder of the second level interconnect system as well as the connection of the second level interconnect to the first level interconnect as well as to the doped polycrystalline silicon gate structures 96 and 98.

It should be noted that thin film resistors may be applied and delineated on the reflowed CVD silicon dioxide 102.

The processing of the wafer is continued with a passivation layer deposition which may be another chemical vapor deposited silicon dioxide or silicon nitride. The structure may be sintered before or after the final passivation layer.

An integrated circuit as illustrated using the specific impurity concentration, times and thicknesses just described will produce transistor devices having the following characteristics:

| $V_{TNMOS} = +1.5V$ | $BV_{DSSNMOS} = 43V$ (Snapback $\geq$ 28V.) | |
|---|---|---|
| $V_{TPMOS} = -1.7V$ | $BV_{DSSPMOS} = 44V$ | |
| | NPN | PNP | SUB-NPN |
| $H_{FE}$ | 300 | 150 | 150 |
| $BV_{CEO}$ | 38 | 35 | 80 |
| $BV_{CBO}$ | 70 | 45 | 160 |
| $BV_{EBO}$ | 7 | 8 | 50 |
| Peak $f_T$ | >400MHZ | >200MHZ | ≈30MHZ |

From the preceding description of the preferred embodiments, it is evident that the objects of the invention are attained in that a process is provided for simultaneous fabrication of high voltage, high performance bipolar transistors and CMOS devices. Although the invention has been illustrated and described in detail, it is to be clearly understood that the same is by way of illustration and example only and is not to be taken by way of limitation. The spirit and scope of the invention are to be limited only by the terms of the appended claims.

What is claimed:

1. In a process for fabricating an integrated circuit in a substrate having high performance, complementary bipolar transistors and complementary insulated gate field effect transistors including base, emitter, source and drain regions, collector, base and body contact regions, gate oxide, gate structure and device contacts the improvement comprising:
    depositing N conductivity type impurities through openings in oxide mask layer to form emitter regions of an NPN bipolar transistors and N contact regions as the last device region forming step;
    removing portions of said oxide mask layer to expose the channel of said field effect transistors;
    forming a gate insulator layer on said substrate;
    forming a layer of doped polycrystalline silicon on said gate insulator layer immediately after forming said gate insulator layer;
    delineating said polycrystalline silicon layer to define field effect transistor gate structures and first level interconnects;
    depositing by chemical vapor deposition a layer of phosphorous doped silicon oxide;
    removing portions of said chemically vapor deposed layer to expose portions of said polycrystalline layer and portions of said oxide mask to expose portions of said substrate;
and
    depositing and delineating a metallic layer to form second level interconnects and contacts.

2. The process according to claim 1 including etching said oxide mask layer after depositing said N conductivity type impurities to remove the topmost impurity containing portion of said oxide mask.

3. The process according to claim 1 including forming oxide in said openings in said oxide mask after depositing said N conductivity type impurities.

4. The process according to claim 1 wherein said gate insulator layer is formed to have a thickness of at least 1300 angstroms.

5. The process according to claim 4 wherein said doped polycrystalline silicon layer is formed by forming a layer of undoped polycrystalline silicon and subsequently doping said layer with phosphorous.

6. The process according to claim 1 including heating said chemical vapor deposited layer to a high temperature environment to cause flow of said layer and subsequently doping said reflowed layer with phosphorous.

7. The process according to claim 6 wherein said high temperature environment is a steam environment at a temperature in the range of 850° C. to 900° C.

8. The process according to claim 1 including forming a diffusion barrier layer on the backside of the substrate before introducing said N conductivity type impurities.

9. The process according to claim 1 including depositing P conductivity type impurities through openings in said oxide mask layer to form PNP emitter regions and P contact regions, and forming oxide in said openings in said oxide mask before depositing said N conductivity type impurities.

10. The process according to claim 1 wherein the steps performed after depositing the N conductivity type impurities are performed at a temperature below 1000° centigrade.

centigrade to a thickness of approximately 2,000 angstroms.

The wafer is then processed through even another photoresist sequence to define apertures in the oxide layer 26 to form emitter region and collector contact for the NPN transistor, the base contact for the PNP transistor, the emitter and collector contact for the NPN substrate transistor, the source and drain contacts for the N channel MOS device and the body contact for the P channel MOS device. N-type impurities, for example, phosphorous, are introduced through the openings in the mask at a temperature of approximately 1,000° centigrade to a junction depth of 1 micron to have a surface impurity concentration of $1 \times 10^{21}$ carriers per cubic centimeter. This deposition is carried out without substantial diffusion. This results in emitter region 70 in base 48, collector contact region 72 in collector contact region 34, base contact region 74 in base region 36, emitter contact 76 in emitter 38, collector contact 78 in collector contact 40, source and drain contacts 80 and 82 in source and drain regions 42 and 44, and body contact 84 in body contact region 46. As in the P+ deposition of the previous step, the N+ regions 70, 72, 74, 76, 78, 80, 82 and 84 will diffuse an additional 4,000 to 5,000 angstroms during the subsequent processing steps.

It should be noted that the back of the wafer is coated with the photoresistant material and not exposed during the photoresist sequence for the N+ masking step. This prevents the oxide on the backside of the wafer from being removed during the etching of the photo mask and consequently prevents N+ impurities from entering the silicon on the backside. This reduces the possibility of auto-doping the MOS channel regions during the gate oxidation of the subsequent steps.

After the N+ deposition, the wafer is subjected to a short etching step to remove the topmost heavy phosphorous portion of oxide layer 26. A hydrofloric etchant of ratio 10 to 1 may be used. This eliminates a severe etching problem during the gate oxide photoresist of the subsequent steps. It should be noted that the phosphorous content of the thermal oxide layer 26 will be increased during later steps for gettering purposes. The wafer is subjected to a short oxidation environment at approximately 850° centigrade to cover the N+ regions with approximately 3,000 angstroms of oxide to prevent phosphorous auto-doping during gate oxidation.

The process at this point has concerned itself with the formation of the doped impurity regions of the bipolar and field effect transistors. The processing sequence will now be concerned with formation of gate oxide and gate structures, as well as first and second level interconnect systems. Since formation of the oxide and gate structure is subsequent to the formation of all semiconductor regions, the previous processing steps had to take into consideration the additional processing temperatures and time cycles.

Figure 4:
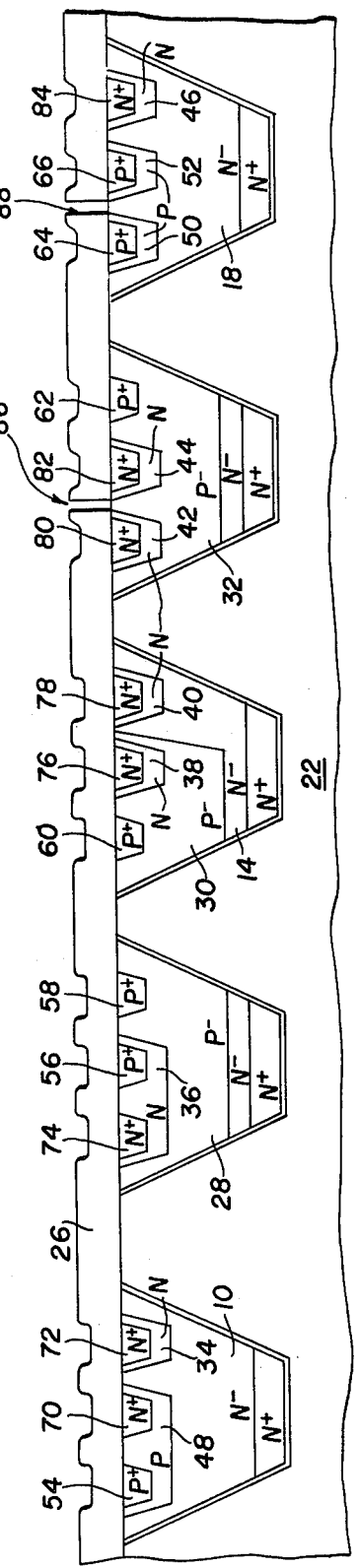

The final phase of the process begins with a photoresist sequence to expose the channel regions for the MOS devices as well as any capacitors which should be formed. As illustrated in FIG. 4, apertures 86 and 88 are formed in the thick oxide layer 26 to expose the channel regions of an N channel MOS and P channel MOS, respectively. Depending on the threshold values of the P and N channel devices desired, a P conductivity type counter-dope ion implant may be performed at this stage. For example, boron may be ion implanted at an energy level of 40,000 volts and a concentration of $2.8 \times 10^{11}$ ions per square centimeter. This will provide a final device threshold voltage on the order of 1.5 volts for each of the P and N channel MOS devices. Without a counter-dope step, the threshold voltage of the N channel device would be in the range of 0.8 to 1.0 volts and the threshold voltage of the P channel device would be in the range of 2.5 to 3.0 volts. This ion implantation is performed non-selectively since the field oxide 26 is sufficiently thick to prevent any contamination of the non-exposed areas.

Figure 5:
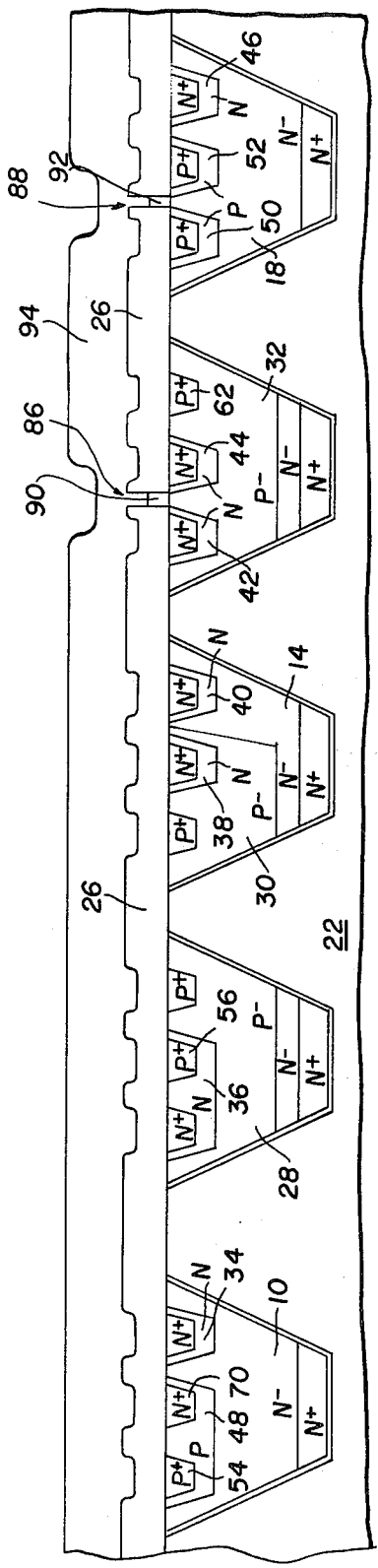

The wafer is then exposed to an oxidizing atmosphere at 950° centigrade for a sufficient period to form the gate insulative layer 90 in aperture 86 and 92 in aperture 88 having a thickness of approximately 1,500 angstroms. Immediately following the formation of the gate insulative layer 90 and 92, a layer of polycrystalline silicon 94 is deposited to a thickness of, for example 6,000 angstroms. The structure is illustrated in FIG. 5. By forming the gate insulator and immediately following by forming polycrystalline silicon layer thereon, mobile ion contamination of the gate oxide insulator 90 and 92 is minimized. Thus, more stable insulated gate field effect transistor devices are formed.

The polycrystalline silicon layer 94, which will form the gate structure for the MOS devices as well as the first level interconnect, is then doped with phosphorous at a temperature of 950° C. and a resistivity of 10–15 ohms per square to result in a final sheet resistance in the range of 50 to 80 ohms per square. Although a suggested polycrystalline silicon layer 94 of 6,000 angstroms and a phosphorous doping temperature and resistivity of 950° C. and 10–15 ohms per square is described, these are but mere examples. The important relationship is that the polycrystalline layer 94 be sufficiently thick and the phosphorous doping not be too high a level such that the subsequent processing steps will not diffuse phosphorous from the phosphorous doped polycrystalline silicon layer 94 into the channels of the insulated gate field effect transistor devices.

Figure 6:
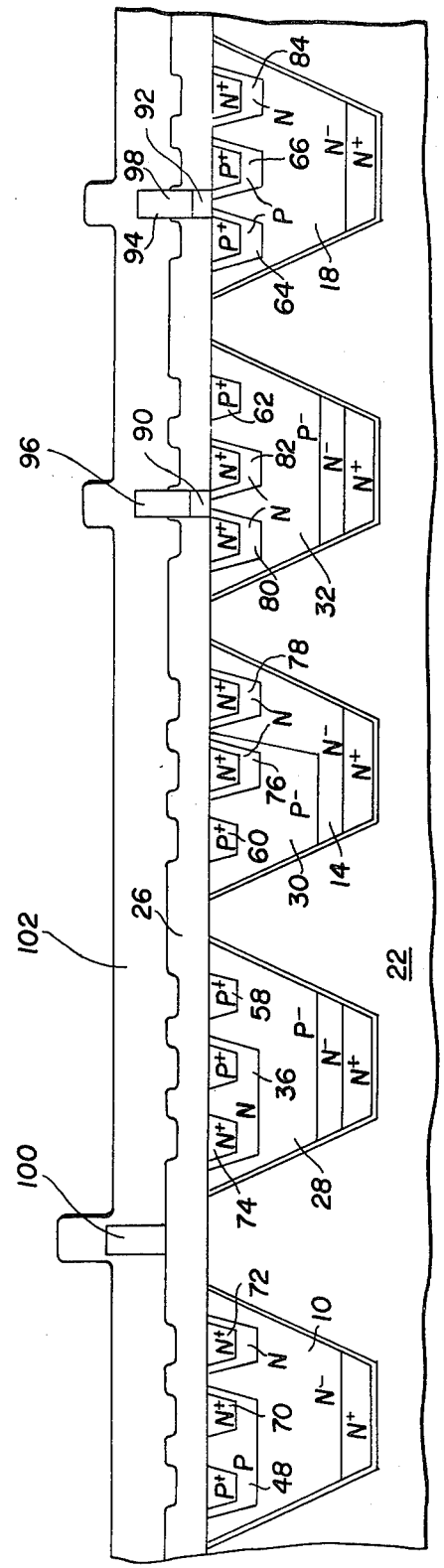

A photoresist sequence is then performed to define the gate for the MOS devices, the first level interconnects, and the top plate for any capacitors formed. As illustrated in FIG. 6, N channel MOS device includes a gate 96 and the P channel MOS device includes a gate 98. The doped polycrystalline silicon layer 94 also forms a first level interconnect illustrated as 100 between the NPN bipolar transistor and the PNP bipolar transistor.

Figure 7:
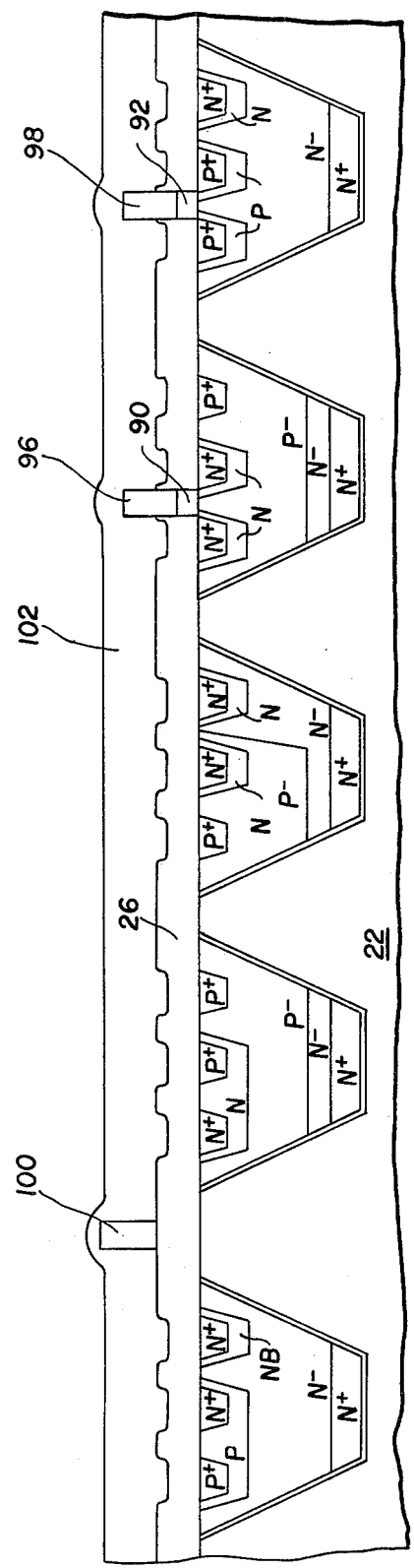

Following the formation and delineation of the polycrystalline silicon layer 94, a phosphorous doped insulative layer of silicon oxide is deposited by chemical vapor deposition. The layer 102 has a thickness of approximately 7,000 angstroms. To provide a smooth surface for the second level interconnects, the CVD silicon dioxide layer 102 is subjected to a steam environment at 850° centigrade for a sufficient period to cause a flow of the top surface. The resulting structure is illustrated in FIG. 7 wherein the large protruding portions of layer 102 above gate elements 96, 98 and interconnect 100 are greatly reduced.

Following the reflow of CVD silicon dioxide layer 102, the wafer is subjected to a phosphorous deposition at a temperature of 835° C. and at a resistivity of 100–300 ohms per square. This will increase the phosphorous concentration at the top and produce a substantial gradient of phosphorous impurity concentration through the profile of the CVD silicon dioxide layer 102. The effect of the phosphorous gradient will cause 11. A process for simultaneously fabricating high voltage, high performance NPN, PNP and P and N channel MOS devices in dielectrically isolated islands comprising:

introducing P conductivity type impurities into selected N conductivity type substrate regions having an impurity concentration of approximately $1 \times 10^{15}$ carriers per cubic centimeter to form a collector region of the PNP and body of an N channel MOS having a surface impurity concentration of approximately $1 \times 10^{16}$ carriers per cubic centimeter;

introducing N conductivity type impurities into said P type collector region to form an N type base region and into said P type body to form N type source and drain regions having a surface impurity concentration of approximately $3 \times 10^{18}$ carriers per cubic centimeter;

introducing P conductivity type impurities into selected N conductivity type substrate regions to form a base region of the NPN and source and drain regions of a P channel MOS having a surface impurity concentration of approximately $5 \times 10^{18}$ carriers per cubic centimeter;

introducing P conductivity type impurities into N conductivity type base regions and selected P conductivity type regions to form emitter regions and contact regions respectively having a surface impurity concentration of approximately $2 \times 10^{20}$ carriers per cubic centimeter;

introducing N conductivity type impurities into P conductivity type base regions and selected N conductivity type regions to form emitter regions and contact regions respectively having a surface impurity concentration of approximately $1 \times 10^{21}$ carriers per cubic centimeter; and forming gate oxide and gate electrode structure for the N and P channel MOS devices.

12. The process according to claim 11 wherein said first mentioned P type impurity introduction is performed by ion implantation and diffusion.

13. The process according to claim 12 wherein the remainder of the impurity introductions are performed by deposition.

14. The process according to claim 13 wherein the first mentioned N-type and second mentioned P-type impurity introduction include diffusion, and said second mentioned N-type and third mentioned P-type impurity introduction do not include a distinct diffusion step.

15. The process according to claim 11 wherein the backside of the substrate is covered by a protective layer before the second mentioned N impurity introduction.

16. The process according to claim 11 wherein said second mentioned P type impurity introduction is performed to form a junction of approximately 1.8 microns.

* * * * *

UNITED STATES PATENT AND TRADEMARK OFFICE
CERTIFICATE OF CORRECTION

PATENT NO. : 4,299,024
DATED : Nov. 10, 1981
INVENTOR(S) : Leo R. Piotrowski

It is certified that error appears in the above—identified patent and that said Letters Patent is hereby corrected as shown below:

Claim 10 (Column 8)

Line 66, delete "the" and insert --said--

Signed and Sealed this

Sixth Day of July 1982

[SEAL]

Attest:

GERALD J. MOSSINGHOFF

Attesting Officer

Commissioner of Patents and Trademarks